United States Patent
Yu et al.

(10) Patent No.: US 7,956,439 B2
(45) Date of Patent: Jun. 7, 2011

(54) VOID BOUNDARY STRUCTURES, SEMICONDUCTOR DEVICES HAVING THE VOID BOUNDARY STRUCTURES AND METHODS OF FORMING THE SAME

(75) Inventors: Cheong-Sik Yu, Seoul (KR); Kyung-Tae Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 791 days.

(21) Appl. No.: 11/730,276

(22) Filed: Mar. 30, 2007

(65) Prior Publication Data

US 2008/0042268 A1 Feb. 21, 2008

(30) Foreign Application Priority Data

Aug. 21, 2006 (KR) .................. 10-2006-0078868

(51) Int. Cl.
*H01L 23/52* (2006.01)
(52) U.S. Cl. ............... 257/522; 257/760; 257/E23.144
(58) Field of Classification Search .............. 257/522, 257/760, E23.144
See application file for complete search history.

(56) References Cited

U.S. PATENT DOCUMENTS

| | | | | |
|---|---|---|---|---|
| 5,776,834 A | * | 7/1998 | Avanzino et al. | 438/692 |
| 5,847,464 A | * | 12/1998 | Singh et al. | 257/752 |
| 7,042,095 B2 | * | 5/2006 | Noguchi et al. | 257/762 |
| 7,098,476 B2 | * | 8/2006 | Babich et al. | 257/E23.144 |
| 7,304,388 B2 | * | 12/2007 | Dubin et al. | 257/E23.144 |
| 7,531,779 B2 | * | 5/2009 | Ahn et al. | 250/208.1 |
| 2001/0040267 A1 | * | 11/2001 | Lien et al. | 257/522 |
| 2002/0135042 A1 | * | 9/2002 | Givens | 257/522 |
| 2006/0154464 A1 | * | 7/2006 | Higashi | 257/763 |

FOREIGN PATENT DOCUMENTS

| | | |
|---|---|---|
| JP | 2004-193431 | 7/2004 |
| KR | 10-2000-0041734 A | 7/2000 |
| KR | 1020010035659 A | 5/2001 |
| KR | 10-2003-0050616 A | 6/2003 |
| KR | 1020050009426 A | 1/2005 |
| KR | 10-2006-0015515 | 2/2006 |
| KR | 10-2000-0043902 A | 7/2007 |

* cited by examiner

*Primary Examiner* — Matthew C Landau
*Assistant Examiner* — Sun M Kim
(74) *Attorney, Agent, or Firm* — Harness, Dickey & Pierce, P.L.C.

(57) ABSTRACT

Void boundary structures, semiconductor devices having the void boundary structures, and methods of forming the same are provided. The structures, semiconductor devices and methods present a way for reducing parasitic capacitance between interconnections by forming a void between the interconnections. The interconnections may be formed on a semiconductor substrate. An upper width of each of the interconnections may be wider than a lower width thereof. A molding layer encompassing the interconnections may be formed. A void boundary layer covering the molding layer may be formed to define the void between the interconnections.

15 Claims, 10 Drawing Sheets

VOID BOUNDARY STRUCTURES, SEMICONDUCTOR DEVICES HAVING THE VOID BOUNDARY STRUCTURES AND METHODS OF FORMING THE SAME

PRIORITY STATEMENT

This application claims priority under 35 USC §119 to Korean Patent Application No. 2006-78868, filed Aug. 21, 2006, in the Korean Intellectual Property Office (KIPO), the entire contents of which are herein incorporated by reference.

BACKGROUND

1. Field

Example embodiments relate to semiconductor devices and methods of forming the same. Other example embodiments relate to void boundary structures, semiconductor devices having the void boundary structures and methods of forming the same.

2. Description of the Related Art

A semiconductor device is manufactured to have highly integrated semiconductor interconnections disposed on a semiconductor substrate corresponding to reduction of a design rule. The design rule determines a pitch of the semiconductor interconnections in a given semiconductor manufacturing process. The reduction of the design rule enables width and spacing of the semiconductor interconnections to be made significantly smaller than allowable parameters for a given semiconductor manufacturing process. The semiconductor interconnections may be made to occupy a relatively small space in a semiconductor device so as to achieve increased integration of the semiconductor device.

The semiconductor interconnections, which have the pitch smaller than the allowable parameters of the given semiconductor manufacturing process, may have undesirable current transmission capability. The reduction of the design rule may increase inner resistance of the semiconductor interconnections and parasitic capacitance between the semiconductor interconnections, thereby inhibiting flow of current. As a result, a semiconductor device may be highly integrated using the semiconductor interconnections with the reduction of the design rule, but it may not have an increased operating speed.

A semiconductor device with inner resistance of interconnections, or parasitic capacitance between the interconnections being reduced in spite of a reduced design rule is disclosed in the conventional art. According to the conventional art, a first insulating layer may be disposed on a semiconductor substrate. Copper interconnections may be disposed on the first insulating layer. A second insulating layer may be formed on the first insulating layer to cover the copper interconnections and form voids between them, and then a third insulating layer may be disposed on the second insulating layer.

However, the conventional art allows the current transmission capability of the copper interconnections to remain at the same level as before reduction of a design rule, or may be incapable of enhancing the current transmission capability of the copper interconnections to the higher level as before the reduction of the design rule. The voids between the copper interconnections may be only formed parallel to the top surface of the semiconductor substrate. When the voids between the copper interconnections are unstably formed, they may be filled with the third insulating layer.

SUMMARY

Example embodiments provide void boundary structures and methods of forming the same, which are suitable for easily defining voids between semiconductor interconnections. Example embodiments provide semiconductor devices having void boundary structures and methods of forming the same, which are suitable for reducing parasitic capacitance between semiconductor interconnections by defining voids between the semiconductor interconnections.

Example embodiments are directed to a void boundary structure including a pair of interconnections on a semiconductor substrate. The pair of interconnections may have plugs and lines with different widths and may be sequentially stacked. A void, between the pair of interconnections, may be defined by a void boundary layer, and the void boundary layer may cover top surfaces of the interconnections. A molding layer may be under the void boundary layer. The molding layer may encompass the pair of interconnections and the void boundary layer between the pair of interconnections.

Example embodiments are directed to a semiconductor device including a pair of studs on a semiconductor substrate. The pair of studs may have plugs with different widths, which are sequentially stacked. A void, between the pair of studs, may be defined by a lower void boundary layer, and the lower void boundary layer may cover top surfaces of the pair of studs. A planarization interlayer insulating layer may be under the lower void boundary layer. The planarization interlayer insulating layer may encompass the pair of studs and the lower void boundary layer between the pair of studs. Interconnections may be electrically connected to the pair of studs. The interconnections may be sequentially stacked and may have a plug and a line, which are different in width. A void, between the interconnections, may be defined by an upper void boundary layer contacting the lower void boundary layer, and an upper void boundary layer may cover top surfaces of the interconnections. A buried interlayer insulating layer may be under the upper void boundary layer. The buried interlayer insulating layer may encompass the interconnections and the upper void boundary layer between the interconnections.

Example embodiments are directed to a method of forming the void boundary structure. A molding layer may be formed on a semiconductor substrate. A pair of holes may be formed in the molding layer. Each hole may have a plug and a line molding part having different diameters sequentially stacked. Interconnections filling the holes may be formed. The molding layer between the interconnections may be removed. A void boundary layer covering the molding layer and the interconnections and defining the void between the interconnections may be formed.

Example embodiments are directed to a method of forming the semiconductor device. A planarization interlayer insulating layer may be formed on a semiconductor substrate. A pair of contact holes may be formed on the planarization interlayer insulating layer. Each of the pair of contact holes may have plug molding parts with different diameters that are sequentially stacked. Studs filling the pair of contact holes may be formed. The planarization interlayer insulating layer between the studs may be removed. A lower void boundary layer covering the planarization interlayer insulating layer and the studs, and defining a void between the studs, may be formed. A buried interlayer insulating layer may be formed on the lower void boundary layer. The buried interlayer insulating layer and the lower void boundary layer may include holes. Each of the holes may have a plug and a line molding part having different diameters that are sequentially stacked. Interconnections filling the holes and electrically connected to the studs may be formed. A lower void boundary layer may be exposed by removing the buried interlayer insulating layer between the interconnections. An upper void boundary layer may be formed to cover the buried interlayer insulating layer and the interconnections and define a void between the interconnections.

BRIEF DESCRIPTION OF THE DRAWINGS

Example embodiments will be more clearly understood from the following detailed description taken in conjunction with the accompanying drawings.

FIG. 1 is a plan view showing a layout of a semiconductor device according to example embodiments.

FIG. 2 is a cross-sectional view taken along line I-I' of FIG. 1.

FIGS. 3 to 9 respectively are cross-sectional views taken along line I-I' of FIG. 1, illustrating a method of forming a semiconductor device.

FIGS. 10 and 11 respectively are cross-sectional views taken along lines II-II' and III-III' of FIG. 1, illustrating a method of forming a semiconductor device together with FIGS. 3 to 9.

DETAILED DESCRIPTION OF EXAMPLE EMBODIMENTS

Figure 1:
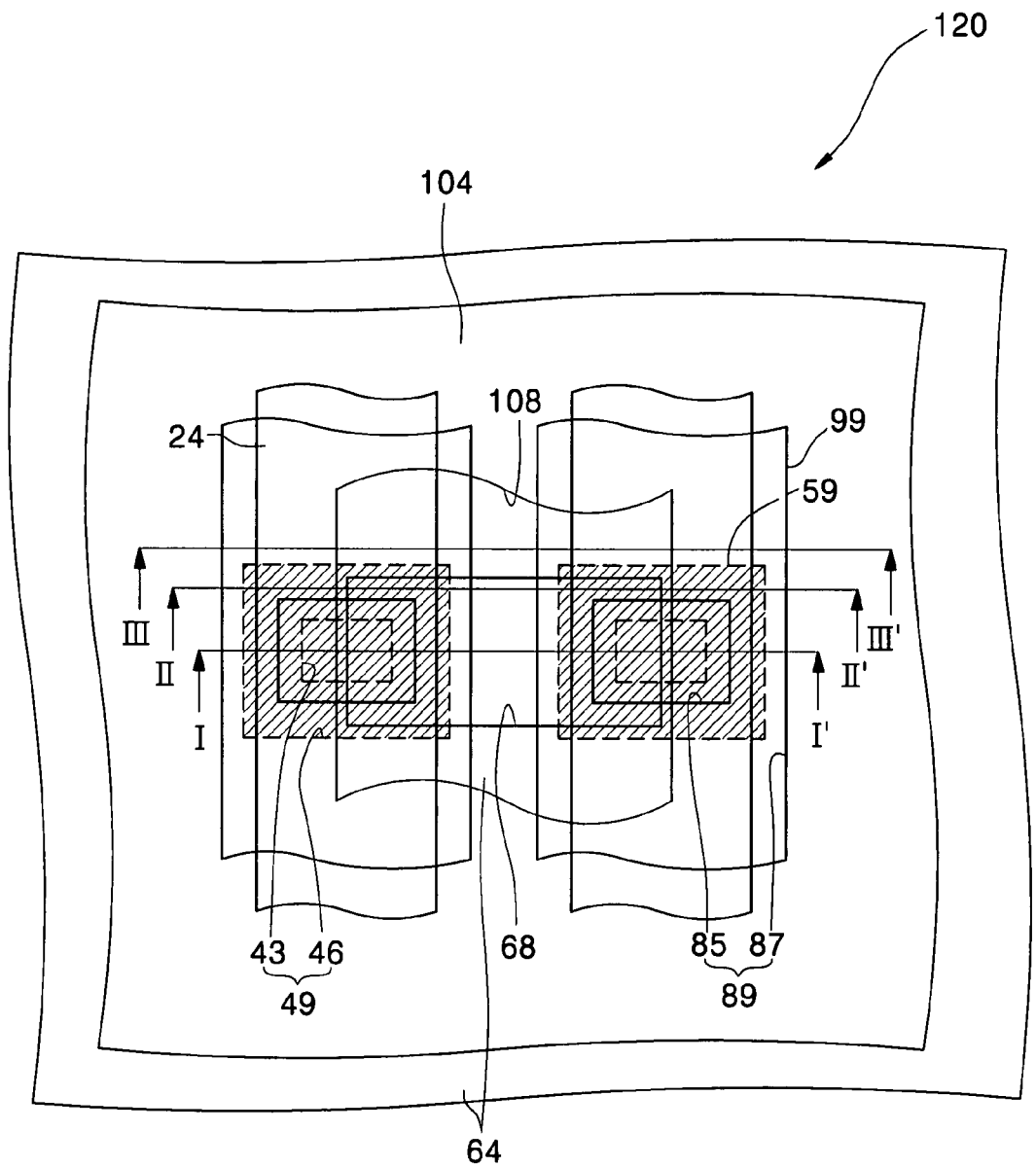
FIGS. 1-11 represent non-limiting, example embodiments as described herein.

Void boundary structures and semiconductor devices having the same according to example embodiments will now be described more fully hereinafter with reference to the accompanying drawings, in which example embodiments are shown. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
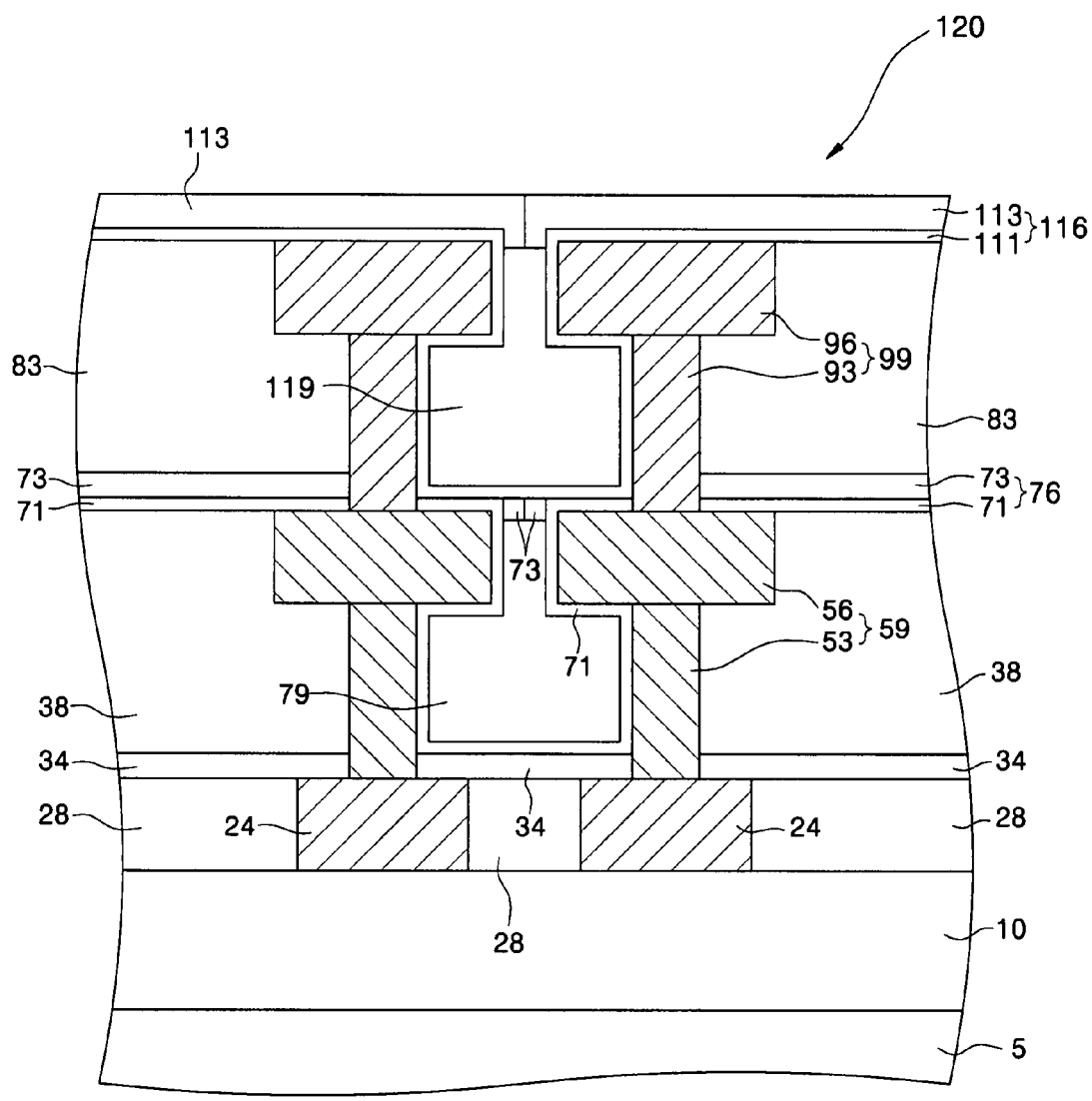

FIG. 1 is a plan view showing a layout of a semiconductor device according to example embodiments, and FIG. 2 is a cross-sectional view taken along line I-I' of FIG. 1. Referring to FIGS. 1 and 2, a semiconductor device 120, according to example embodiments, may include a pair of studs 59 disposed on a semiconductor substrate 5. The respective studs 59 may include metal nitride material, and aluminum (Al), copper (Cu) and/or a combination thereof disposed on the metal nitride material. The metal nitride material may constitute a barrier layer preventing or retarding diffusion of aluminum (Al), copper (Cu) and/or a combination thereof. The respective studs 59 may have plugs 53 and 56 stacked sequentially. The plugs 53 and 56 may have different widths. The width of the plug 53 may be smaller than the plug 56.

A lower void boundary layer 76 may be between the studs 59. The lower void boundary layer 76 may define a void 79 between the studs 59. The lower void boundary layer 76 also may cover top surfaces of the studs 59. The lower void boundary layer 76 may have a lower sealed layer 71 and a lower buried layer 73, which are sequentially stacked. A planarization interlayer insulating layer 38 may be under the lower void boundary layer 76. The planarization interlayer insulating layer 38 may encompass the studs 59 and the lower void boundary layer 76 between the studs 59. The planarization interlayer insulating layer 38 may include a material having at least one of metal and non-metal atoms in a lattice of silicon oxide. The planarization interlayer insulating layer 38 may form a lower void boundary structure with the studs 59 and the lower void boundary layer 76. The planaraization interlayer insulating layer 38 may also be referred to as a molding layer.

The lower sealed layer 71 may cover a sidewall of one stud 59, may extend to a neighboring stud 59 facing the one stud 59, and may cover a sidewall of the neighboring stud 59 to open a space between the studs 59. The lower sealed layer 71 may include a material having at least one of metal and non-metal atoms in a lattice of silicon nitride. The lower sealed layer 71 may be formed of silicon nitride. The lower buried layer 73 may be on the lower sealed layer 71 to close the space between the studs 59. The lower buried layer 73 may include a material having at least one of metal and non-metal atoms in a lattice of silicon oxide.

Referring back to FIGS. 1 and 2, interconnections 99 may be on the studs 59. The interconnections 99 may be disposed to respectively contact the studs 59. The respective interconnections 99 may include metal nitride material, and aluminum (Al), copper (Cu) and/or a combination thereof formed on the metal nitride material. The metal nitride material may constitute a barrier layer preventing or retarding diffusion of aluminum (Al), copper (Cu) and/or a combination thereof. The interconnections 99 may be disposed along an extension line on top surfaces of the studs 59. The respective interconnections 99 may have a plug 93 and a line 96 stacked thereon. The plug 93 and the line 96 may have different widths. The width of the plug 93 may be smaller than the line 96.

An upper void boundary layer 116 may be between the interconnections 99. The upper void boundary layer 116 may contact the lower void boundary layer 76 to define a void 119. The upper void boundary layer 116 also may cover top surfaces of the interconnections 99 and may be between the interconnections 99. The upper void boundary layer 116 may have an upper sealed layer 111 and an upper buried layer 113, which may be sequentially stacked. A buried interlayer insulating layer 83 may be under the upper void boundary layer 116. The buried interlayer insulating layer 83 may encompass the interconnections 99 and the upper void boundary layer 116 between the interconnections 99. The buried interlayer insulating layer 83 may include a material having at least one of metal and non-metal atoms in a lattice of silicon oxide. The buried interlayer insulating layer 83 may form an upper void boundary structure with the interconnections 99 and the upper void boundary layer 116.

According to example embodiments, a plurality of the upper void boundary structures may be on the lower void boundary layer 76. When the plurality of upper void boundary structures are disposed, the interconnections 99 in the upper void boundary structures may pass through a plurality of upper void boundary layers 116, a plurality of buried interlayer insulating layers 83 and the lower void boundary layer 76 to contact the studs 59. The interconnections 99 in the upper void boundary structures may electrically connect to one another.

Referring back to FIGS. 1 and 2, the upper sealed layer 111 may cover a sidewall of one interconnection 99, may extend to a neighboring interconnection 99 facing the one interconnection 99, and may cover a sidewall of the neighboring interconnection 99 to open a space between the interconnections 99. The upper sealed layer 111 may include a material having at least one of metal and non-metal atoms in a lattice of silicon nitride. The upper sealed layer 111 may be formed of silicon nitride. The upper buried layer 113 may be disposed on the upper sealed layer 111 to close the space between the interconnections 99. The upper buried layer 113 may have the same dielectric constant as the lower buried layer 73. The upper buried layer 113 may have a different dielectric constant from the lower buried layer 73. The upper buried layer 113 may include a material having at least one of metal and non-metal atoms in a lattice of silicon oxide. The upper buried layer 113, the buried interlayer insulating layer 83, and the planarization interlayer insulating layer 38 may have different dielectric constants.

Again referring back to FIGS. 1 and 2, base interconnections 24 may be disposed under the studs 59, respectively. The respective base interconnections 24 may include metal nitride material, and aluminum (Al), copper (Cu) and/or a combination thereof formed on the metal nitride material. The metal nitride material may constitute a barrier layer preventing or retarding diffusion of aluminum (Al), copper (Cu) and/or a combination thereof. A pad interlayer insulating layer 28 may encompass the base interconnections 24. The pad interlayer insulating layer 28 may include material having at least one of metal or non-metal atoms in a lattice of silicon oxide.

A capping layer 34 may be between the pad interlayer insulating layer 28 and the planarization interlayer insulating layer 38. The capping layer 34 may encompass the studs 59 with the planarization interlayer insulating layer 38. The capping layer 34 may include material having at least one of metal and non-metal atoms in a lattice of silicon nitride. The capping layer 34 may be formed of silicon nitride. According to example embodiments, a plurality of the lower void boundary structures may be disposed on the capping layer 34. When the plurality of lower void boundary structures are disposed, the studs 59 in the lower void boundary structures may pass through a plurality of lower void boundary layers 76, a plurality of planarization interlayer insulating layers 38 and the capping layer 34 to contact the base interconnections 24. The studs 59 in the lower void boundary structures may be electrically connected.

A device insulating layer 10 may be between the capping layer 34 and the semiconductor substrate 5. The device insulating layer 10 may cover semiconductor discrete elements (not shown). The device insulating layer 10 may include material having at least one of metal or non-metal atoms in a lattice of silicon oxide. The device insulating layer 10 may be formed of silicon oxide. The device insulating layer 10 may be an insulating material with a multilayer structure.

Figure 3:
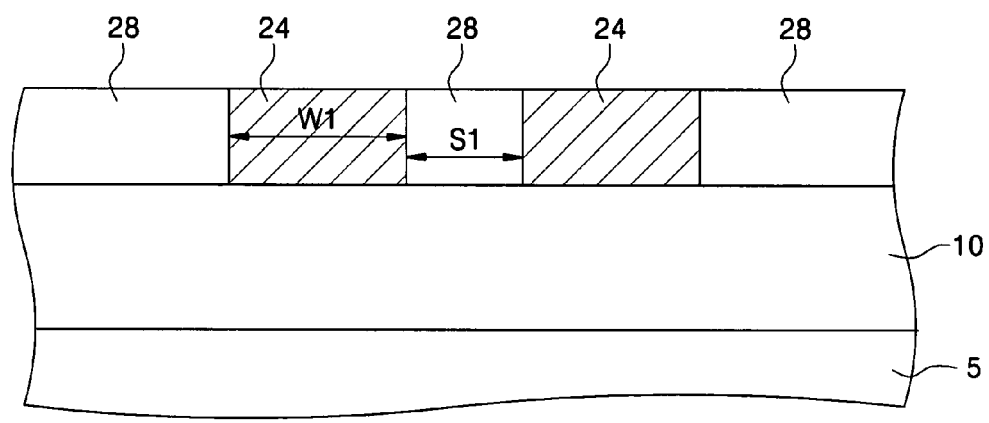

Methods of forming void boundary structures and semiconductor devices having the same according to example embodiments will now be described in detail with reference to the accompanying drawings. FIGS. 3 to 9 respectively are cross-sectional views taken along line I-I' of FIG. 1, illustrating a method of forming a semiconductor device. Referring to FIGS. 1 and 3, a device insulating layer 10 may be formed on a semiconductor substrate 5. The device insulating layer 10 may be formed to cover semiconductor discrete elements (not shown). The device insulating layer 10 may include a material having at least one of metal and non-metal atoms in a lattice of silicon oxide. The device insulating layer 10 may be formed of silicon oxide. The device insulating layer 10 may be formed of insulating material with a multilayer structure.

Base interconnections 24 may be formed on the device insulating layer 10. The base interconnections 24 may extend perpendicular to line I-I' of FIG. 1. The respective base interconnections 24 may include metal nitride material, and aluminum (Al), copper (Cu) and/or a combination thereof formed on the metal nitride material. The metal nitride material may constitute a barrier layer preventing or retarding diffusion of aluminum (Al), copper (Cu) and/or a combination thereof. The base interconnections 24 may have a predetermined or given pitch (W1+S1) and be formed in a pair.

The base interconnections 24 may have the same width W1 and be spaced by a certain distance S1 from each other. The base interconnections 24 may be formed to different widths. A pad interlayer insulating layer 28 may be formed to encompass the base interconnections 24. The pad interlayer insulating layer 28 may include a material having at least one of metal and non-metal atoms in a lattice of silicon oxide. The pad interlayer insulating layer 28 may be formed to have a different dielectric constant from the device insulating layer 10.

Figure 4:
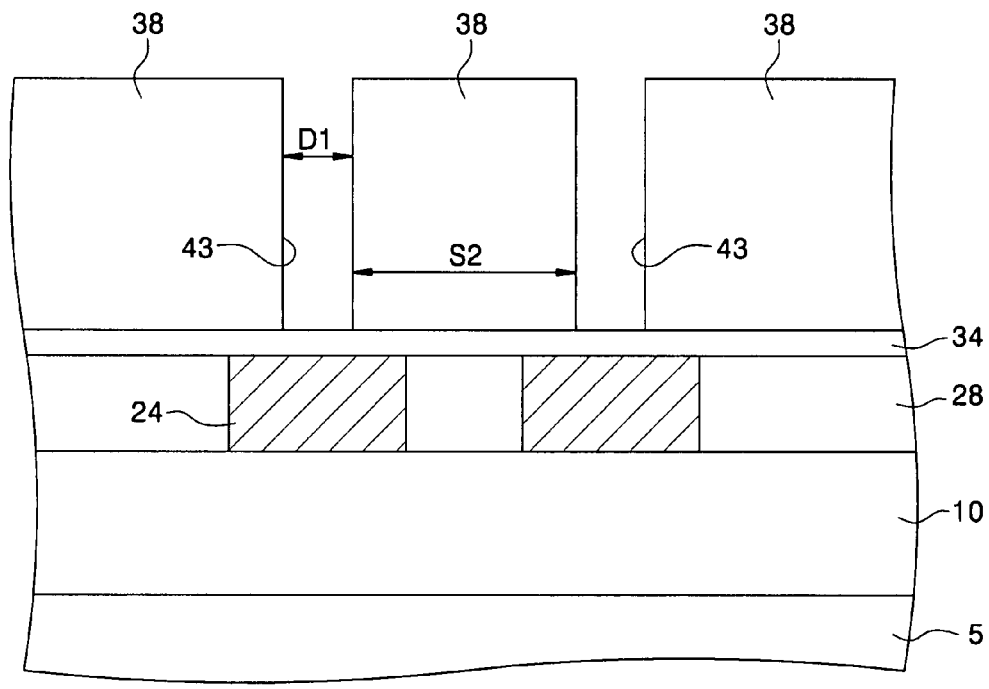

Referring to FIGS. 1 and 4, a capping layer 34 may be formed to cover the pad interlayer insulating layer 28 and the base interconnections 24. The capping layer 34 may include a material having at least one of metal and non-metal atoms in a lattice of silicon nitride. The capping layer 34 may be formed of silicon nitride. A planarization interlayer insulating layer 38 may be formed on the capping layer 34. The planarization interlayer insulating layer 38 may include a material having at least one of metal and non-metal atoms in a lattice of silicon oxide. The planarization interlayer insulating layer 38 may include an insulating layer having a different etch rate from the capping layer 34.

Lower via holes 43 may be formed to pass through predetermined or given regions of the planarization interlayer insulating layer 38, respectively. The lower via holes 43 may be respectively aligned with the base interconnections 24 to expose the capping layer 34. The lower via holes 43 may be formed to have a predetermined or given pitch (D1+S2). The lower via holes 43 may have the same diameter (D1) and be spaced a certain distance (S2) from each other. The lower via holes 43 may be formed to have different diameters.

Figure 5:
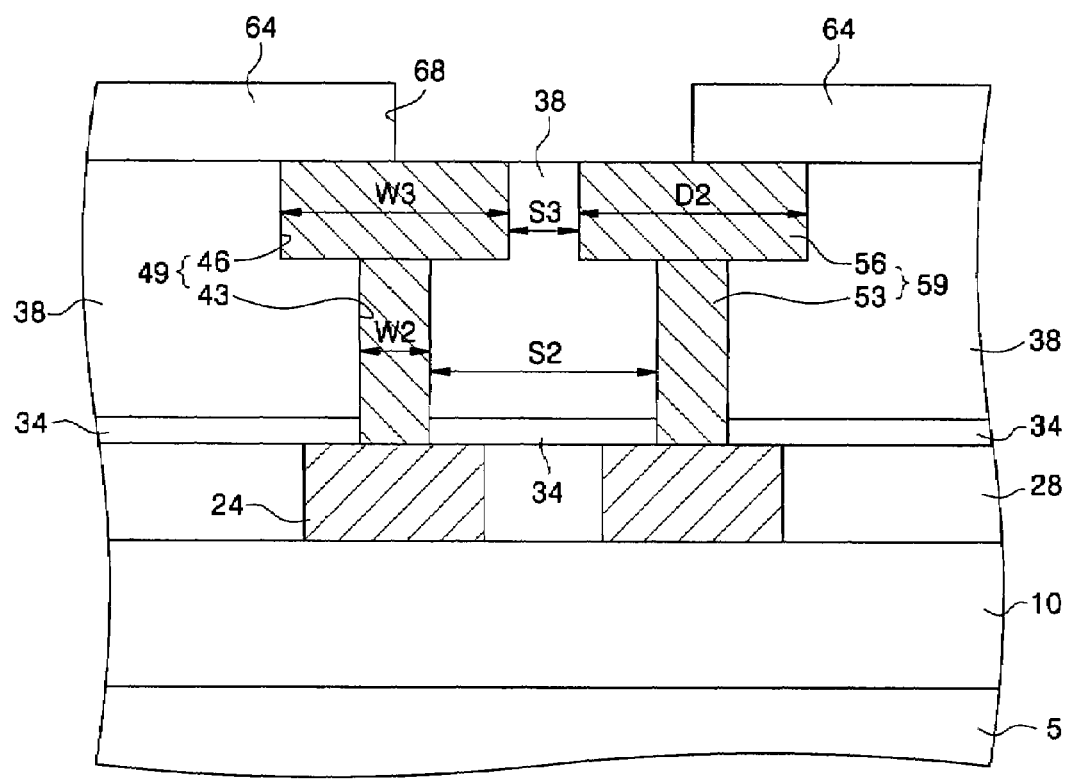

Referring to FIGS. 1 and 5, the planarization interlayer insulating layer 38 may be partially etched to form lower trenches 46 on the lower via holes 43, respectively. The lower trenches 46 may be formed to expose the base interconnections 24, respectively. The lower trenches 46 may be formed to have a predetermined or given pitch (D2+S3). The lower trenches 46 may have the same diameter (D2) and be spaced by a certain distance (S3) from each other. The lower trenches 46 may be formed to have different diameters from each other. Accordingly, the respective lower trenches 46 and the respective lower via holes 43 may be formed to be stacked sequentially as shown in FIG. 1, and thus may be formed as plug molding parts with different diameters. The respective lower via holes 43 and the respective lower trenches 46 may form one contact hole 49.

Studs 59 may be formed to fill the contact holes 49. The studs 59 may correspond to slashed regions of FIG. 1, respectively. The respective studs 59 may include metal nitride material, and aluminum (Al), copper (Cu) and/or a combination thereof formed on the metal nitride material. The metal nitride material may constitute a barrier layer preventing or retarding diffusion of aluminum (Al), copper (Cu) and/or a combination thereof. The respective studs 59 may be divided into plugs 53 and 56 corresponding to the respective lower via holes and the respective lower trenches 43 and 46. The plugs 53 and 56 may have different widths W2 and W3. A lower mask layer 64 may be formed on the studs 59 and the planarization interlayer insulating layer 38. The lower mask layer 34 may be formed of an insulating layer having a different etch rate from the planarization interlayer insulating layer 38. The lower mask layer 64 may be formed to have a first alignment hole 68 exposing the planarization interlayer insulating layer 38 between the studs 59 as shown in FIG. 1 or 5.

Figure 6:
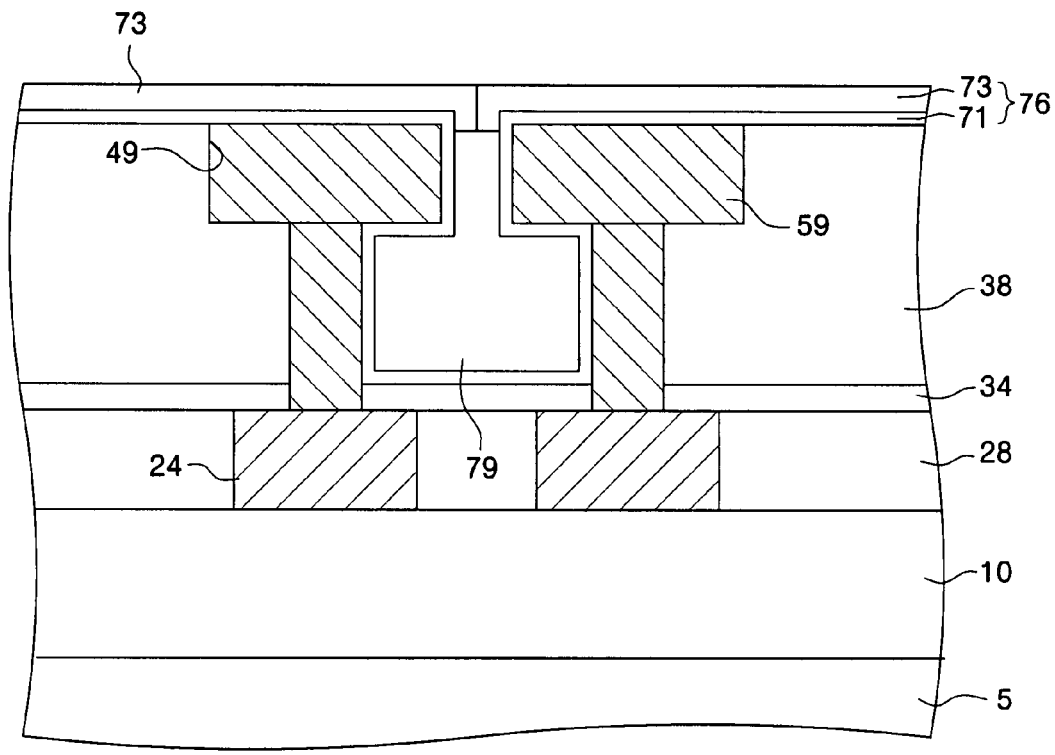

Referring to FIGS. 1 and 6, the planarization interlayer insulating layer 38 may be etched through the first alignment hole 68 using the lower mask layer 64 as an etch mask to expose the capping layer 34. The lower mask layer 64 may be removed from the studs 59 and the planarization interlayer insulating layer 38. A lower void boundary layer 76 may be formed between the studs 59. The lower void boundary layer 76 may cover the studs 59 and the planarization interlayer insulating layer 38 to define a void 79 between the studs 59. The planarization interlayer insulating layer 38 may form a lower void boundary structure with the studs 59 and the lower void boundary layer 76.

According to example embodiments, referring to FIGS. 4 to 6, a plurality of the lower void boundary structures may be formed by sequentially and repeatedly performing the steps of forming the planarization interlayer insulating layer 38, forming the contact holes 49, forming the studs 59, removing the planarization interlayer insulating layer 38, and forming the lower void boundary layer 76 on the capping layer 34. When the plurality of lower void boundary structures are formed, the studs 59 in the lower void boundary structures may pass through a plurality of lower void boundary layers 76, a plurality of planarization interlayer insulating layers 38 and the capping layer 34 to contact the base interconnections 24. The studs 59 in the lower void boundary structures may be formed to be electrically connected.

Referring back to FIGS. 1 and 6, the lower void boundary layer 76 may be formed to have a lower sealed layer 71 and a lower buried layer 73, which are sequentially stacked. The lower sealed layer 71 may cover a sidewall of one stud 59, extend to a neighboring stud facing the one stud 59, and cover a sidewall of the neighboring stud 59 in order to open a space between the studs 59. The lower buried layer 73 may be formed on the lower sealed layer 71 to close the space between the studs 59.

The lower buried layer 73 may include a material having at least one of metal and non-metal atoms in a lattice of silicon oxide. The lower buried layers 73 may be formed to have a different dielectric constant from the planarization interlayer insulating layer 38. The lower buried layer 73 may have a lower dielectric constant than the planarization interlayer insulating layer 38. The lower sealed layer 71 may include a material having at least one of metal and non-metal atoms in a lattice of silicon nitride. The lower sealed layer 71 may be formed of silicon nitride.

Figure 7:
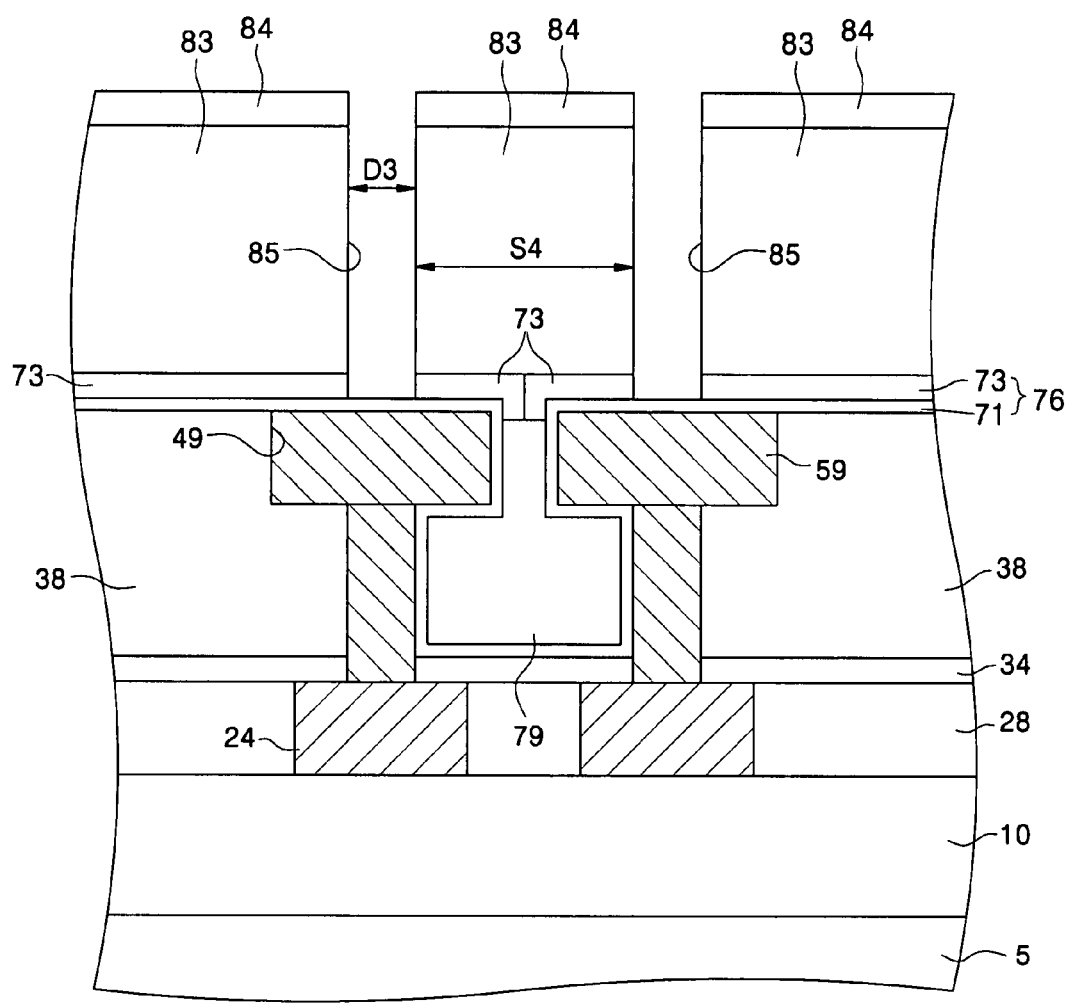

Referring to FIGS. 1 and 7, a buried interlayer insulating layer 83 and a passivation layer 84 may be sequentially formed on the lower void boundary layer 76. The passivation layer 84 may be formed of an insulating layer having a different etch rate from the buried interlayer insulating layer 83. The buried interlayer insulating layer 83 may include a material having at least one of metal and non-metal atoms in a lattice of silicon oxide. Upper via holes 85 may be formed in the lower void boundary layer 76 through predetermined or given regions of the passivation layer 84 and the buried interlayer insulating layer 83.

The upper via holes 85 may be respectively aligned with the studs 59 and formed to expose the lower sealed layer 71. The upper via holes 85 may be formed to have a predetermined or given pitch (D3+S4). The upper via holes 85 may have the same diameter (D3), and be spaced by a certain distance (S4) from each other. The upper via holes 85 may be formed to have different diameters. The passivation layer 84 may not be deposited when a circle defining the upper via holes 85 may be clearly formed in the buried interlayer insulating layer 83 and when seen in a plan view after performance of photolithography and etch processes on the buried interlayer insulating layer 83.

Figure 8:
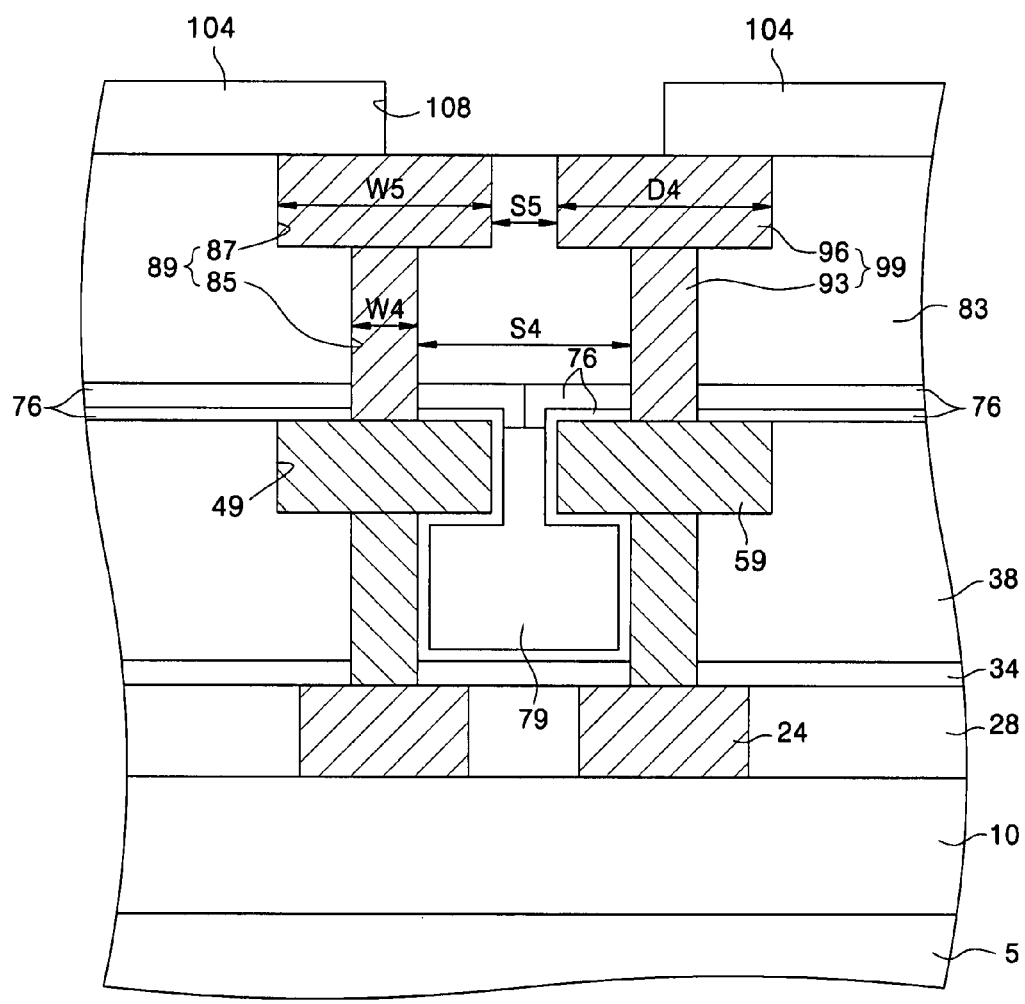

Referring to FIGS. 1 and 8, the passivation layer 84 and the buried interlayer insulating layer 83 may be partially etched to form upper trenches 87 on the upper via holes 85, respectively. The respective upper trenches 87 may be formed to expose the respective studs 59. The upper trenches 87 may be formed to have a predetermined or given pitch (D4+S5). The upper trenches 87 may be spaced by a certain distance (S5) from each other with the same diameter (D4). The upper trenches 87 may be formed to have different diameters.

The respective upper trenches 87 and the respective upper via holes 85 may be formed to be stacked sequentially and thus formed as plug and line molding parts which may have different diameters. The respective upper via holes 85 and the respective upper trenches 87 form one hole 89. Interconnections 99 may be formed to fill the holes 89, respectively. The interconnections 99 may be formed to contact the studs 59, respectively. The interconnections 99 may extend perpendicular to line I-I' of FIG. 1. While forming the interconnections 99, the passivation layer 84 may be removed from the buried interlayer insulating layer 83.

The respective interconnections 99 may include metal nitride material, and aluminum (Al), copper (Cu) and/or a combination thereof formed on the metal nitride material. The metal nitride material may constitute a barrier layer protecting diffusion of aluminum (Al), copper (Cu) and a combination thereof. The respective interconnections 99 may be divided into a plug 93 and a line 96 corresponding to the respective upper via holes 85 and the respective upper trenches 87. The plug 93 and the line 96 may have different widths W4 and W5. An upper mask layer 104 may be formed on the interconnections 99 and the buried interlayer insulating layer 83. The upper mask layer 104 may be formed to have a second alignment hole 108 exposing the buried interlayer insulating layer 83 between the interconnections 99 as shown in FIG. 1 or 8. The upper mask layer 104 may be formed of an insulating layer having a different etch rate from the buried interlayer insulating layer 83.

Figure 9:
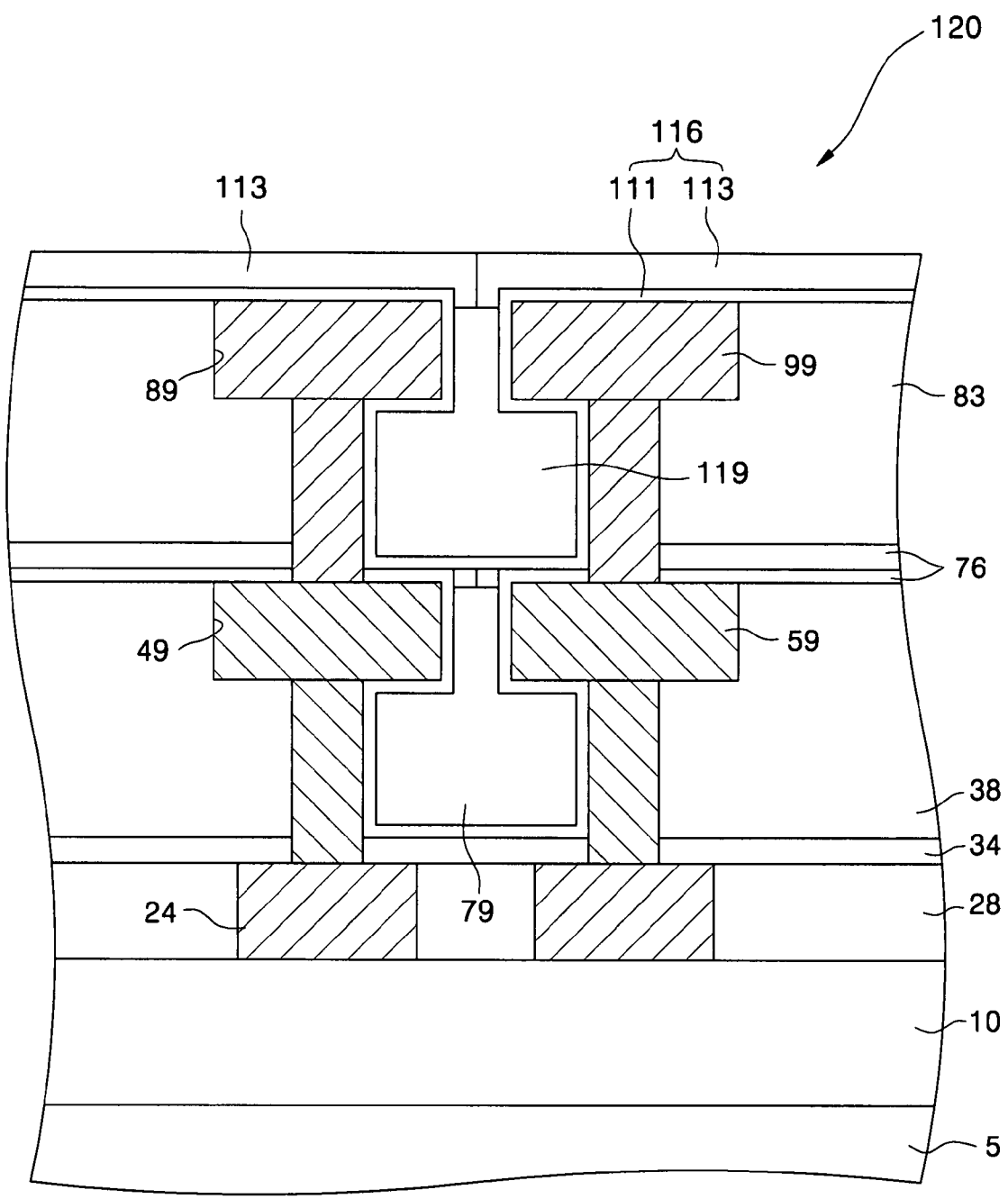

Referring to FIGS. 1 and 9, the buried interlayer insulating layer 83 and the lower buried layer 73 may be etched through the second alignment hole 108 to expose the lower sealed layer 71 using the upper mask layer 104 as an etch mask. The upper mask layer 104 may be removed from the interconnections 99 and the buried interlayer insulating layer 83. An upper void boundary layer 116 may be formed between the interconnections 99. The upper void boundary layer 116 may cover the buried interlayer insulating layer 83 and the interconnections 99 and may define the void 119 between the interconnections 99. The upper void boundary layer 116 may form an upper void boundary structure with the buried interlayer insulating layer 83 and the interconnections 99.

Referring to FIGS. 7 to 9, according to example embodiments, a plurality of the upper void boundary structures may be formed by sequentially and repeatedly performing the steps of forming the buried interlayer insulating layer 83, forming the holes 89, forming the interconnections 99, exposing the lower void boundary layer 76, and forming the upper void boundary layer 116 on the lower void boundary layer 76. When the plurality of upper void boundary structures are formed, the interconnections 99 in the upper void boundary structures may contact the studs 59 through a plurality of upper void boundary layers 116, a plurality of buried interlayer insulating layers 83 and the lower void boundary layer 76. The interconnections 99 in the upper void boundary structures may be electrically connected.

The upper void boundary layer 116 may have an upper sealed layer 111 and an upper buried layer 113, which are sequentially stacked. The upper sealed layer 111 may cover a sidewall of one interconnection 99, extend to a neighboring interconnection facing the one interconnection 99, and cover a sidewall of the neighboring interconnection 99 in order to open a space between the interconnections 99. The upper buried layer 113 may be disposed on the upper sealed layer 111 to close the space between the interconnections 99. The upper buried layer 113 may include a material having at least one of metal and non-metal atoms in a lattice of silicon oxide.

The upper buried layer 113 and the buried interlayer insulating layer 83 may be formed to have different dielectric constants. The upper buried layer 113 may have a lower dielectric constant than the buried interlayer insulating layer 83. The upper sealed layer 111 may include a material having at least one of metal and non-metal atoms in a lattice of silicon nitride. The upper sealed layer 111 may be formed of silicon nitride. As a result, example embodiments may form a semiconductor device 120 including the upper void boundary layer 116, the interconnections 99, the lower void boundary layer 76, and the studs 59 on the semiconductor substrate 5.

Referring back to FIGS. 1 and 9, the upper void boundary layer 116 may form the void 119 between the interconnections 99. The respective interconnections 99 may diagonally pass the void 119 to face the respective studs 59 opposite to the respective interconnections 99. Of course, the interconnections 99 may be arranged parallel to the semiconductor substrate 5, to face each other around the void 119. Parasitic capacitance between the interconnections 99 may be reduced by use of the void 119. Parasitic capacitance between the interconnections 99 and the studs 59 may be reduced by the use of the void 119.

The lower void boundary layer 76 may form a void 79 between the studs 59. The void 79 may be formed under the void 119 between the interconnections 99. The respective studs 59 may diagonally pass the void 79 to face the respective base interconnections 24 opposite to the respective studs 59. The studs 59 may be arranged parallel to the semiconductor substrate 5, to face each other around the void 79. Parasitic capacitance between the studs 59 may be reduced by use of the void 79. Parasitic capacitance between the studs 59 and the base interconnections 24 may be reduced by the use of the void 79.

Figure 10:
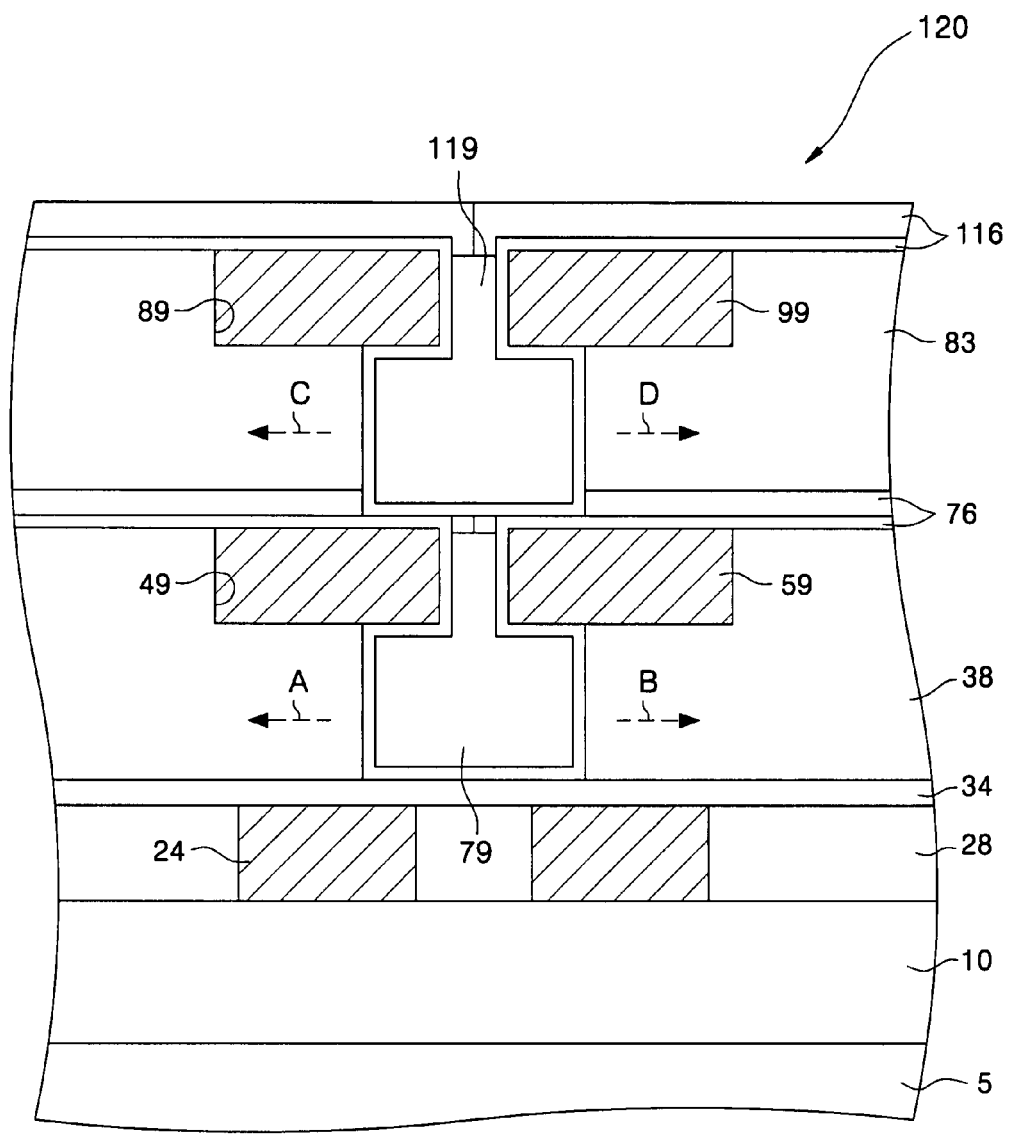
Figure 11:
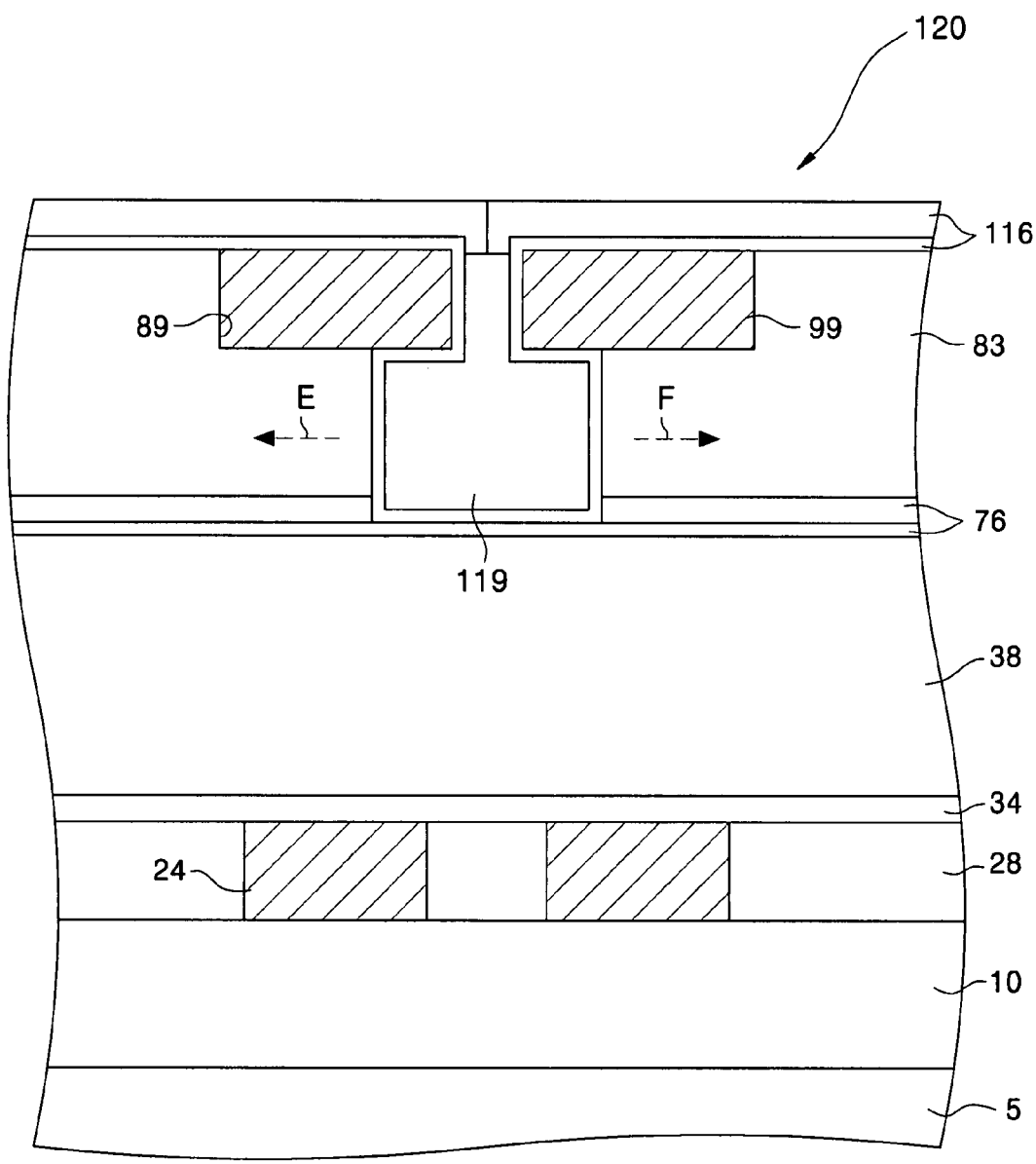

FIGS. 10 and 11 respectively are cross-sectional views taken along lines II-II' and III-III' of FIG. 1, illustrating a method of forming a semiconductor device together with FIGS. 3 and 9. Referring to FIGS. 1 and 10, the upper void boundary layer 116 may form the void 119 between the interconnections 99. The respective interconnections 99 may perpendicularly or diagonally pass the void 119 to face the respective studs 59 opposite to the respective interconnections 99. The interconnections 99 may be arranged parallel to the semiconductor substrate 5 to face each other around an upper portion of the void 119. Parasitic capacitance between the interconnections 99, as well as between the interconnections 99 and the studs 59, may be reduced by use of the void 119.

The lower void boundary layer 76 may form the void 79 between the studs 59. The void 79 may be formed under the void 119 between the interconnections 99. The respective studs 59 may perpendicularly or diagonally pass the void 79 to face the respective base interconnections 24 opposite to the respective studs 59. The studs 59 may be arranged parallel to the semiconductor substrate 5 to face each other around an upper portion of the void 79. Parasitic capacitance between the studs 59, and between the studs 59 and the base interconnections 24, may be reduced by use of the void 79.

The void 79 may extend in directions (A and B) parallel to a top surface of the semiconductor substrate 5 in a semiconductor manufacturing process. Parasitic capacitance between the studs 59 and the base interconnections 24 as well as between the studs 59 may be reduced by use of the void 79. The void 119 between the interconnections 99 may also extend in directions (C and D) parallel to the top surface of the semiconductor substrate 5 in the semiconductor manufacturing process. Parasitic capacitance between the studs 59 and the interconnections 99 as well as between the interconnections 99 may be further reduced by the use of the void 119.

Referring to FIGS. 1 and 11, the upper void boundary layer 116 may form the void 119 between the interconnections 99. The respective interconnections 99 may perpendicularly or diagonally pass the void 119 to face the respective base interconnections 24 opposite to the respective interconnections 99. The interconnections 99 may be arranged parallel to the semiconductor substrate 5 to face each other around an upper portion of the void 119. Parasitic capacitance between the interconnections 99 may be reduced by use of the void 119. Parasitic capacitance between the interconnections 99 and the base interconnections 24 may be reduced by the use of the void 119. The interconnections 99 may be formed to extend in a direction perpendicular to line III-III' of FIG. 1. The void 119 between the interconnections 99 may extend in directions (E and F) parallel to the top surface of the semiconductor substrate 5 in the semiconductor manufacturing process. Parasitic capacitance between the interconnections 99 and the base interconnections 24 as well as the interconnections 99 may be further reduced by the void 119.

As described the above, example embodiments provide void boundary structures suitable for easily defining the void between semiconductor interconnections, semiconductor devices having the structures, and methods of forming the same. Void boundary structures may improve current transmission capability of the semiconductor interconnections.

Example embodiments have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the following claims.

What is claimed is:

1. A void boundary structure, comprising:
a pair of interconnections on a semiconductor substrate, wherein each of the pair of interconnections includes a plug and a line with different widths that are sequentially stacked;
a void boundary layer defining a void between the pair of interconnections, covering top surfaces of the pair of interconnections, connecting the pair of interconnections on the top surfaces of the pair of interconnections, and extending downwardly from the top surfaces of the pair of interconnections into an adjacent region of the void between the pair of interconnections; and
a molding layer contacting a portion of the void boundary layer in substantially the same level as the top surfaces of the pair of interconnections, and encompassing the pair of interconnections and the remaining portion of the void boundary layer between the pair of interconnections under the top surface of the pair of interconnections,
wherein the void boundary layer includes a buried layer and a sealed layer, the sealed layer covering a sidewall of one of the pair of interconnections, extending to a neighboring interconnection of the pair of interconnections facing the one interconnection of the pair of interconnections and covering a sidewall of the neighboring interconnection of the pair of interconnections in order to open a space between the pair of interconnections, and the buried layer is on the sealed layer to close the space between the pair of interconnections.

2. The void boundary structure according to claim 1, wherein the buried layer and the molding layer include material having at least one of metal and non-metal atoms in a lattice of silicon oxide, and the sealed layer includes silicon nitride.

3. The void boundary structure according to claim 1, wherein the buried layer and the molding layer have different dielectric constants.

4. The void boundary structure according to claim 1, wherein the pair of interconnections include a metal nitride material, and aluminum (Al), copper (Cu) or a combination thereof formed on the metal nitride material.

5. The void boundary structure according to claim 1, wherein at least one void boundary structure is on the semiconductor substrate.

6. A semiconductor device, comprising:
a pair of studs on a semiconductor substrate, wherein each of the pair of studs includes plugs with different widths that are sequentially stacked;
a lower void boundary layer defining a void between the pair of studs, covering top surfaces of the pair of studs, connecting between the pair of studs on the top surfaces of the pair of studs, and extending downwardly from the top surfaces of the pair of studs into an adjacent region of the void between the pair of studs;
a planarization interlayer insulating layer contacting a portion of the lower void boundary layer in substantially the same level as the top surfaces of the pair of studs, and encompassing the pair of studs and the remaining portion of the lower void boundary layer between the pair of studs under the top surface of the pair of studs;
interconnections respectively contacting the pair of studs, wherein the interconnections include a plug and a line with different widths that are sequentially stacked;
an upper void boundary layer contacting the lower void boundary layer to define a void between the interconnections, covering top surfaces of the interconnections, connecting between the interconnections on the top surfaces of the interconnections, and extending downwardly from the top surfaces of the interconnections into an adjacent region of the void between the interconnections; and
a buried interlayer insulating layer contacting a portion of the upper void boundary layer in substantially the same level as the top surfaces of the pair of interconnections, and encompassing the interconnections and the remaining portion of the upper void boundary layer between the interconnections under the top surface of the pair of interconnections.

7. The semiconductor device according to claim 6, wherein the upper void boundary layer includes an upper buried layer and an upper sealed layer, the upper sealed layer covering a sidewall of one interconnection, extending to a neighboring interconnection facing the one interconnection and covering a sidewall of the neighboring interconnection in order to open a space between the interconnections, and the upper buried layer on the upper sealed layer to close the space between the interconnections.

8. The semiconductor device according to claim 7, wherein the upper sealed layer includes silicon nitride, and the upper buried layer and the buried interlayer insulating layer includes a material having at least one of metal and non-metal atoms in a lattice of silicon oxide.

9. The semiconductor device according to claim 6, wherein the buried interlayer insulating layer, the interconnections and the upper void boundary layer constitute an upper void boundary structure, and the upper void boundary structure is on at least one of the pair of studs.

10. The semiconductor device according to claim 6, wherein the lower void boundary layer includes a lower buried layer and a lower sealed layer, the lower sealed layer covering a sidewall of one stud, extending to a neighboring stud facing the one stud and covering a sidewall of the neighboring stud in order to open a space between the pair of studs, and the lower buried layer on the lower sealed layer to close the space between the pair of studs.

11. The semiconductor device according to claim 10, wherein the lower sealed layer includes silicon nitride, and the lower buried layer and the planarization interlayer insulating layer include a material having at least one of metal and non-metal atoms in a lattice of silicon oxide.

12. The semiconductor device according to claim 11, wherein the lower and upper buried layers have the same dielectric constant, and the upper buried layer, the planarization interlayer insulating layer and the buried interlayer insulating layer have different dielectric constants.

13. The semiconductor device according to claim 6, wherein each of the pair of studs and the interconnections includes a metal nitride material, and aluminum (Al), copper (Cu) or a combination thereof formed on the metal nitride material.

14. The semiconductor device according to claim 6, wherein the planarization interlayer insulating layer, the pair of studs and the lower void boundary layer constitute a lower void boundary structure and at least one lower void boundary structure is on the semiconductor substrate.

15. The semiconductor device according to claim 6, wherein the lower void boundary layer has a recessed portion between the pair of interconnections on the studs, and the upper void boundary layer contacts the lower void boundary layer through the recessed portion of the lower void boundary layer.

* * * * *